United States Patent
Schuehrer et al.

(10) Patent No.: US 7,259,091 B2
(45) Date of Patent: Aug. 21, 2007

(54) TECHNIQUE FOR FORMING A PASSIVATION LAYER PRIOR TO DEPOSITING A BARRIER LAYER IN A COPPER METALLIZATION LAYER

(75) Inventors: Holger Schuehrer, Dresden (DE); Carsten Hartig, Meerane (DE); Christin Bartsch, Lauterbach (DE); Kai Frohberg, Meissen (DE)

(73) Assignee: Advanced Micro Devices, Inc., Austin, TX (US)

( * ) Notice: Subject to any disclaimer, the term of this patent is extended or adjusted under 35 U.S.C. 154(b) by 111 days.

(21) Appl. No.: 11/112,509

(22) Filed: Apr. 22, 2005

(65) Prior Publication Data

US 2006/0024951 A1 Feb. 2, 2006

(30) Foreign Application Priority Data

Jul. 30, 2004 (DE) ............... 10 2004 037 089

(51) Int. Cl.
*H01L 21/4763* (2006.01)

(52) U.S. Cl. ............... 438/627; 438/751; 257/E21.57; 257/E21.52

(58) Field of Classification Search ........... 438/627, 438/751, 749, 906; 257/E21.529, E21.579
See application file for complete search history.

(56) References Cited

U.S. PATENT DOCUMENTS

| | | | |
|---|---|---|---|
| 6,123,088 A | 9/2000 | Ho | 134/1.3 |
| 6,458,516 B1* | 10/2002 | Ye et al. | 430/317 |
| 6,531,382 B1 | 3/2003 | Cheng et al. | 438/597 |
| 6,554,914 B1* | 4/2003 | Rozbicki et al. | 148/238 |
| 6,605,549 B2 | 8/2003 | Leu et al. | 438/758 |
| 6,692,580 B2 | 2/2004 | Wu et al. | 134/26 |
| 6,815,823 B2* | 11/2004 | Teh et al. | 257/758 |
| 2001/0021489 A1* | 9/2001 | Wakiya et al. | 430/329 |
| 2003/0010751 A1 | 1/2003 | Wu | 216/105 |
| 2004/0029051 A1 | 2/2004 | Koita et al. | 430/313 |
| 2004/0106531 A1* | 6/2004 | Kanno et al. | 510/175 |
| 2004/0171211 A1* | 9/2004 | Lee et al. | 438/243 |
| 2005/0014667 A1* | 1/2005 | Aoyama et al. | 510/175 |
| 2005/0139419 A1* | 6/2005 | Green | 182/3 |
| 2005/0245409 A1* | 11/2005 | Cernat et al. | 510/175 |

FOREIGN PATENT DOCUMENTS

| | | |
|---|---|---|
| EP | 1 447 440 A1 | 8/2004 |
| JP | 08202052 A | 8/1996 |

* cited by examiner

*Primary Examiner*—Caridad M. Everhart
(74) *Attorney, Agent, or Firm*—Williams, Morgan & Amerson, P.C.

(57) ABSTRACT

By performing a wet chemical process after etching a via, contaminations may be removed and a thin passivation layer may be formed that may then be readily removed in a subsequent sputter etch process for forming a barrier/adhesion layer. In a particular embodiment, the wet chemical process may be performed on the basis of fluoric acid and triazole or a compound thereof.

10 Claims, 3 Drawing Sheets

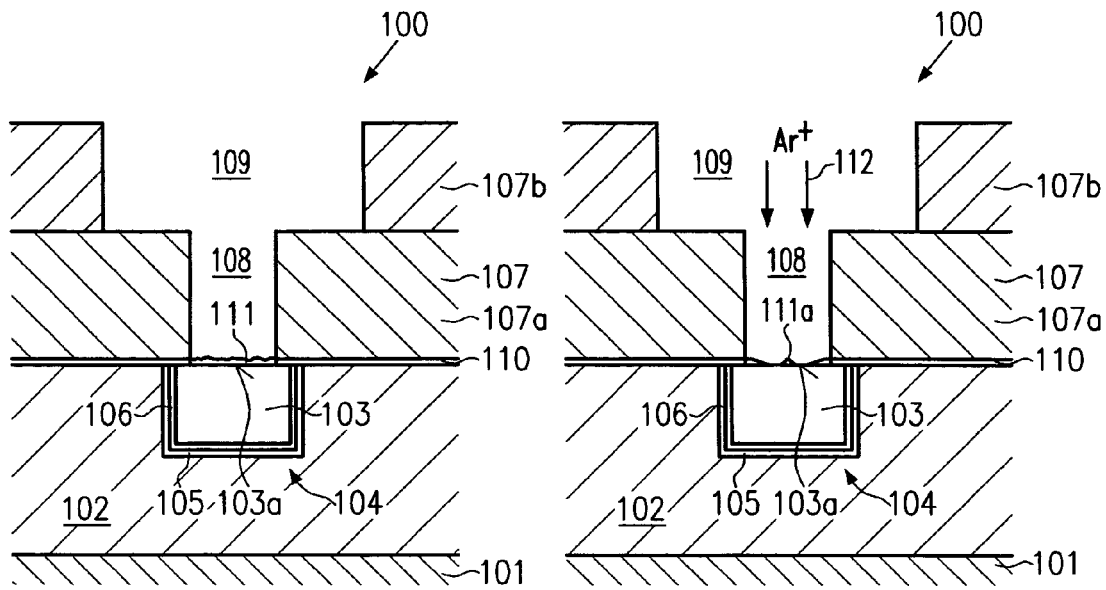
Fig. 1a (prior art)
Fig. 1b (prior art)
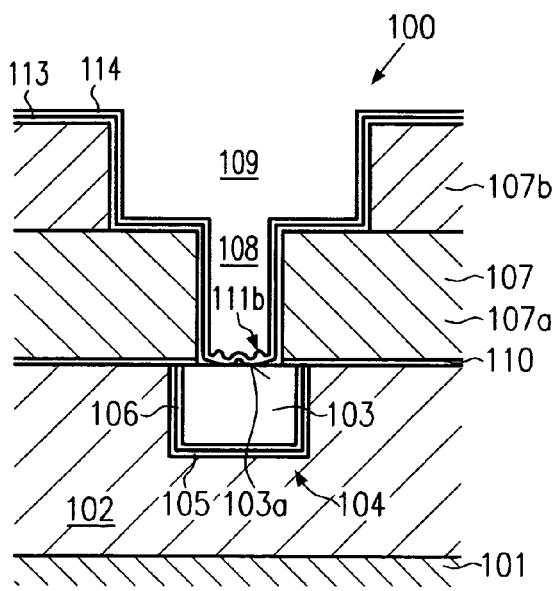
Fig. 1c (prior art)

TECHNIQUE FOR FORMING A PASSIVATION LAYER PRIOR TO DEPOSITING A BARRIER LAYER IN A COPPER METALLIZATION LAYER

BACKGROUND OF THE INVENTION

1. Field of the Invention

Generally, the present invention relates to the formation of integrated circuits, and, more particularly, to the formation of metallization layers including highly conductive metals, such as copper, embedded into a dielectric material having low permittivity to enhance device performance.

2. Description of the Related Art

In an integrated circuit, a huge number of circuit elements, such as transistors, capacitors, resistors and the like, are formed in or on an appropriate substrate, usually in a substantially planar configuration. Due to the large number of circuit elements and the required complex layout of the integrated circuits, generally the electrical connection of the individual circuit elements may not be established within the same level on which the circuit elements are manufactured, but requires one or more additional "wiring" layers, also referred to as metallization layers. These metallization layers generally include metal-containing lines, providing the inner-level electrical connection, and also include a plurality of inter-level connections, also referred to as vias, filled with an appropriate metal and providing the electrical connection between two neighboring stacked metallization layers, wherein the metal-containing lines and vias may also be commonly referred to as interconnects.

Due to the continuous shrinkage of the feature sizes of circuit elements in modern integrated circuits, the number of circuit elements for a given chip area, that is the packing density, also increases, thereby requiring an even larger increase in the number of electrical interconnections to provide the desired circuit functionality. Therefore, the number of stacked metallization layers usually increases as the number of circuit elements per chip area becomes larger. The fabrication of a plurality of metallization layers entails extremely challenging issues to be solved, such as mechanical, thermal and electrical reliability of up to twelve stacked metallization layers that may be employed on sophisticated aluminum-based microprocessors. However, semiconductor manufacturers are increasingly replacing the well-known metallization metal aluminum by a metal that allows higher current densities and hence allows a reduction in the dimensions of the interconnections and thus the number of stacked metallization layers. For example, copper is a metal generally considered to be a viable candidate for replacing aluminum due to its superior characteristics in view of higher resistance against electromigration and significantly lower electrical resistivity when compared with aluminum. Despite these advantages, copper also exhibits a number of disadvantages regarding the processing and handling of copper in a semiconductor facility. For instance, copper may not be efficiently applied onto a substrate in larger amounts by well-established deposition methods, such as chemical vapor deposition (CVD), and also may not be effectively patterned by the usually employed anisotropic etch procedures. Consequently, in manufacturing metallization layers including copper, the so-called damascene technique (single and dual) is therefore preferably used wherein a dielectric layer is first applied and then patterned to receive trenches and vias, which are subsequently filled with copper. A further major drawback of the use of copper is its propensity to readily diffuse in many dielectric materials, such as silicon dioxide, which is a well-established and approved dielectric material in fabricating integrated circuits.

It is therefore necessary to employ a so-called barrier material in combination with a copper-based metallization to substantially avoid any diffusion of copper into the surrounding dielectric material, as copper may readily migrate to sensitive semiconductor areas, thereby significantly changing the characteristics thereof. The barrier material provided between the copper and the dielectric material should, however, in addition to the required barrier characteristics, exhibit good adhesion to the dielectric material as well as to the copper to impart superior mechanical stability to the interconnect and should also have as low an electrical resistance as possible so as to not unduly compromise the electrical properties of the interconnection.

With the continuous shrinkage of features sizes of the circuit elements, the dimensions of the interconnects are reduced too, thereby also necessitating a reduced layer thick-ness of the barrier materials in interconnects so as to not unduly consume precious space of the actual metal that exhibits a considerably higher conductivity compared to the barrier material. Hence, complex barrier technologies are required to support further device scaling, wherein the usage of dielectric materials with reduced permittivity may even impart further increased constraints to the barrier layer, as will be described with reference to FIGS. 1a-1c for a typical process technique for sophisticated copper-based integrated circuits.

FIG. 1a depicts a schematic cross-sectional view of a semiconductor structure 100 comprising a substrate 101, for example, a semiconductor substrate bearing a plurality of individual circuit elements (not shown), such as transistors, resistors, capacitors and the like. The substrate 101 is representative of any type of appropriate substrate with or without any additional circuit elements and may, in particular, represent sophisticated integrated circuit substrates having included therein circuit elements with critical feature sizes in the deep sub-micron range. A first dielectric layer 102 is formed above the substrate 101 and includes a conductive region 104, for instance an interconnect feature comprised of a metal line 103, such as a copper line, and a first barrier layer 106 comprised of tantalum, and a second barrier layer 105 comprised of tantalum nitride. The dielectric layer 102 and the interconnect feature 104 may represent a first metallization layer. An etch stop layer 110 comprised of, for instance, silicon nitride, nitrogen-enriched silicon carbide and the like, is formed above the dielectric layer 102 and partially above the copper line 103. A second dielectric layer 107 comprised of a dielectric material including at least a material of low permittivity, as is typically used for obtaining reduced parasitic capacitances between adjacent metal lines, is formed over the etch stop layer 110 and the first dielectric layer 102 and has formed therein a trench 109 and a via 108 connecting to the metal line 103, thereby exposing a contamination layer 111 located on a surface portion 103a of the copper line 103. For example, the dielectric layer 107 may be comprised of fluorine-doped silicon dioxide deposited from TEOS, which is also referred to as FTEOS, and which has a lower permittivity compared to pure TEOS silicon dioxide. In other approaches, the dielectric layer 107 may include a first sub-layer 107a comprised of FTEOS silicon dioxide and a second dielectric layer 107b comprised of a so-called low-k material, as the parasitic capacitances between laterally adjacent metal lines are more critical than between vias and vertically adjacent metal lines.

A typical process flow for forming the semiconductor structure 100 as shown in FIG. 1a may include the following steps, wherein, for the sake of simplicity, only the formation of the second metallization layer, i.e., the second dielectric layer 107 and the metal interconnect feature to be formed therein, will be described in detail as the processes in forming the interconnect feature 104 in the first dielectric layer 102 may substantially involve the same process steps. Thus, after planarizing the dielectric layer 102, including the interconnect feature 104, and forming the etch stop layer 110, thereby passivating the interconnect feature 104, as pure copper forms a highly reactive surface, the dielectric layer 107 is deposited by well-known deposition methods, such as plasma enhanced chemical vapor deposition (PECVD), spin-on techniques and the like, wherein, as previously pointed out, silicon dioxide including fluorine deposited from TEOS by chemical vapor deposition is frequently employed. Subsequently, the dielectric layer 107 is patterned by well-known photolithography and anisotropic etch techniques, wherein an intermediate etch stop layer (not shown) may be used in patterning the trench 109.

It should further be noted that different approaches may be employed in forming the trench 109 and the via 108, such as a so-called via first trench last approach, or a trench first via last approach, wherein, in the former approach, the via 108 may be filled with metal prior to the formation of the trench 109. In the present example, a so-called dual damascene technique is described in which the trench 109 and the via 108 are simultaneously filled with metal. Irrespective of the etch scheme used, in the last etch step, the etch stop layer 110 is opened and the copper surface 103a is exposed to the reactive etch ambient, which may contain fluorine, in particular when the dielectric layer 107 also comprises fluorine. As a consequence, the contamination layer 111 containing a copper/fluorine/oxygen compound is formed on the surface portion 103a. Since the contamination layer 111 may significantly affect the further processes, such as the formation of a barrier layer and seed layer for the subsequent copper fill process, thereby reducing via reliability and lowering product yield and reliability, the contamination layer 111 may be removed by a wet chemical etch process on the basis of, for example, diluted fluoric acid (HF). It has been found that during this wet chemical process, the contamination layer 111 is effectively removed yet the surface portion 103a is again exposed to a reactive environment, thereby resulting in a recreation of a contamination layer having a similar negative effect on the further processing as the layer 111. Consequently, during the process of forming a barrier/adhesion layer, a sputter pre-clean process is performed for removing contaminants from the surface portion 103a.

FIG. 1b schematically shows the semiconductor structure 100 during an initial phase of a sputter process, indicated as 112, wherein argon ions may be directed to the surface portion 103a in an attempt to remove the contamination layer 111 or contaminants 111a that are still left after the wet chemical clean process that may optionally be performed. Thereafter, the sputter parameters are adjusted to deposit a barrier/adhesion layer, for instance on the basis of tantalum and/or tantalum nitride. Owing to the incomplete removal of the contaminants 111a during the initial pre-clean process, irregularities may still be present at the surface portion 103a after the formation of the barrier/adhesion layer, the formation of a seed layer and the deposition of the bulk copper.

FIG. 1c schematically shows the semiconductor structure 100 with a barrier/adhesion layer 113 and a copper seed layer 114 formed on the structure 100 and within the trench 109 and the via 108. At the surface portion 103a, irregularities 111b may be formed, which may lead to a reduced via reliability due to, for instance, an increased transition resistivity between the via 108, after being filled with copper, and the metal line 103. The problem of reduced via reliability is even exacerbated for highly scaled devices, since the reduced cross-section of the via 108 may require even more restricted margins with respect to resistivity fluctuations of the vias 108.

In view of the above-identified problems, there is a need for an improved technique allowing the formation of more reliable metal interconnects, especially of copper interconnects, in highly scaled semiconductor devices.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique that enables a significant reduction of structural irregularities formed within a via that connects to a metal-containing region. During the formation of a via in a dielectric layer in accordance with a damascene process technique, an exposed metal surface, which may be highly reactive if, for example, copper is used, is treated to passivate the reactive surface while at the same time substantially reducing inhomogeneously distributed surface contaminations. After this surface treatment, a barrier/adhesion layer may be formed, preceded by a pre-clean process, which leads to a significant reduction of irregularities in the via compared to conventional approaches. Consequently, device failure caused by defective vias may be reduced even for extremely scaled devices having a metallization on the basis of copper.

According to one illustrative embodiment of the present invention, a method comprises forming a via in a dielectric layer, wherein the via connects to a metal region located below the via. Furthermore, a surface portion of the metal region that is exposed during the formation of the via is cleaned and a passivation layer is formed on the surface portion. Furthermore, the passivation layer is removed to expose the surface portion and a barrier/adhesion layer is deposited on the exposed surface portion.

In accordance with yet another illustrative embodiment of the present invention, a method comprises forming a via in a dielectric layer, wherein the via connects to a metal region located below the via. Moreover, a surface portion of the metal region that is exposed during the formation of the via is treated by a wet chemical formulation including a surface reactant. Thereafter, the surface portion is cleaned and a barrier/adhesion layer is formed on the surface portion.

According to still another illustrative embodiment of the present invention, a method comprises preparing a plurality of different formulations for a wet chemical clean process, wherein each formulation comprises an etchant and a corrosion inhibitor. Then, a plurality of vias is formed in a dielectric layer wherein the vias connect to respective metal regions formed below the vias. At least some of the plurality of vias are treated with the plurality of different formulations under specified process conditions to modify an exposed surface portion of the respective metal regions. Thereafter, at least one characteristic of the plurality of vias and respective metal regions is determined and an appropriate composition and target process parameters for the wet chemical clean process are selected on the basis of the determined at least one characteristic. Finally, a plurality of substrates including vias formed in a dielectric layer are treated with the appropriate composition and the target process parameters during the formation of a metallization layer of a semiconductor device.

BRIEF DESCRIPTION OF THE DRAWINGS

The invention may be understood by reference to the following description taken in conjunction with the accompanying drawings, in which like reference numerals identify like elements, and in which:

FIGS. 1a-1c schematically show cross-sectional views of a semiconductor structure including an interconnect feature formed in a dielectric material, wherein irregularities in the metal may be created by contamination of an exposed surface portion during the formation of a via according to a conventional technique;

Figure 2A:
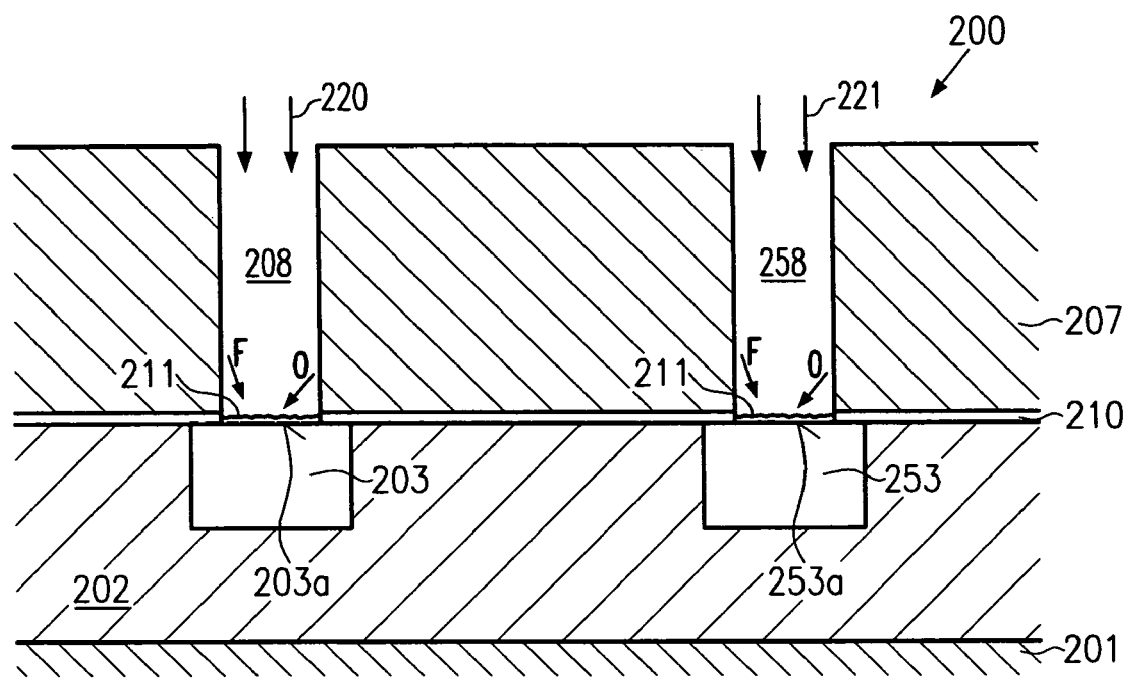
FIGS. 2a-2b schematically show a semiconductor structure during the formation of a plurality of vias over respective metal regions including a surface treatment of exposed metal surfaces by a plurality of different wet chemical formulations.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present invention is based on the finding that a surface contamination of exposed metal regions during the formation of vias in a dielectric layer may lead to a reduced reliability and yield, especially when semiconductor devices are considered that are fabricated on the basis of copper or copper compounds and copper alloys. As previously explained, especially fluorine may react with an exposed copper-based surface, thereby generating a plurality of surface defects, which may lead to significant irregularities during the further processing of the semiconductor devices. It has therefore been contemplated to remove the surface contaminations by an appropriately designed etch process, preferably by a wet chemical etch process, while at the same time reducing or eliminating the recreation of inhomogeneously distributed contaminations, but instead provide a substantially homogeneous surface modification that may be removed afterwards more effectively. The modified surface, which substantially avoids any further surface reaction with any reactive components being present in the environment or within material layers of the device, is then subjected to a pre-clean process prior to the formation of a barrier/adhesion layer, wherein the substantially homogeneous surface modification may enable the exposure of the pure metal in a more uniform manner as compared to conventional approaches, thereby also significantly improving the process uniformity of the subsequent deposition processes, which finally results in less structural irregularities and defect rates. Consequently, total yield as well as reliability of the wiring layers of the devices are significantly enhanced.

With reference to FIGS. 2a-2b and 3a-3d, further illustrative embodiments of the present invention will now be described in more detail. FIG. 2a schematically shows a cross-sectional view of a semiconductor structure 200 comprising a substrate 201 having formed thereon a plurality of metal regions 203, 253. The substrate 201 may represent any appropriate substrate, such as a silicon substrate, a silicon-on-insulator (SOI) substrate, or any other insulating or semiconductive substrate. The metal regions 203 and 253 may represent any metal that is suitable for forming metallization layers in semiconductor devices and may represent, in particular embodiments, a copper-based region, that is, the regions 203 and 253 may be comprised of copper, copper compounds, copper alloys and the like. Moreover, the metal regions 203 and 253 may include any barrier/adhesion layers as considered appropriate, these, however, not being shown in FIGS. 2a and 2b for the sake of clarity.

In some embodiments, the semiconductor structure 200 may represent a test structure formed on a test substrate and the plurality of metal regions 203 and 253 may be a part of a continuous metal layer. In some embodiments, the metal regions 203 and 253 may be formed in a dielectric layer 202, or, when provided as a substantially continuous metal layer, may be formed directly on the substrate 201. Formed above the dielectric layer 202 and partially above the metal regions 203 and 253 is an etch stop layer 210, which may be comprised of silicon nitride, silicon carbide, nitrogen-enriched silicon carbide and the like. A dielectric layer 207, which may include two or more sub-layers, is formed on the etch stop layer 210, wherein the dielectric layer 207 is preferably formed in view of material composition, layer composition, and layer thickness to correspond to design values of a semiconductor device of interest that is to be produced in a semiconductor facility. As previously explained with reference to the dielectric layer 107, illustrated in FIGS. 1a-1c, the dielectric layer 207 also may be comprised of any appropriate material, such as silicon dioxide, fluorine-enriched silicon dioxide, a low-k material, possibly in combination with another dielectric material, and the like. In one particular embodiment, the dielectric layer 207 represents a fluorine-doped silicon dioxide layer formed in accordance with deposition recipes as are used in the formation of highly sophisticated semiconductor devices having a copper-based metallization.

Moreover, corresponding vias 208 and 258 are formed above the metal regions 203 and 253, respectively, wherein the dimensions of the vias 208 and 258 may preferably be selected in accordance with design rules of a semiconductor device of interest. On surface portions of the metal regions 203 and 253, a layer 211 is formed, which includes substantially inhomogeneously distributed contaminations caused by a reaction with reactive components, such as fluorine, oxygen and the like, which may be liberated during an etch process for forming the vias 208 and 258, and/or which may be introduced by the etch atmosphere.

A typical process for forming the semiconductor structure 200 as shown in FIG. 2a may comprise the following processes. After forming the metal regions 203, 253 by, for instance, a damascene technique involving the formation of trenches in the dielectric layer 202 and a subsequent fill of metal into the trenches, or by forming a continuous layer over the substrate 201 by means of a sputter deposited seed layer and a subsequent electroplating process, the etch stop layer 210 is formed by well-established techniques, such as plasma enhanced chemical vapor deposition (PECVD).

Thereafter, the dielectric layer 207 is formed by any appropriate deposition technique, depending on the material composition, layer composition and the like. It should be noted that, in view of establishing an appropriate process recipe for removing the contamination layer 211 by a corresponding wet chemical etch process, it may be advantageous to form the semiconductor structure 200, in particular, the layers 210 and 207, in accordance with process strategies of interest to gain information on the process of forming the vias 208 and 258, which may be directly transferred to a corresponding production process. Hence, the dielectric layer 207 may be comprised, in some embodiments, of a dielectric material on the basis of silicon and oxygen having a moderately low permittivity, such as fluorine-doped silicon dioxide, hydrogenated silicon oxycarbide and the like. For example, fluorine-doped silicon dioxide may advantageously be deposited by well-established PECVD techniques on the basis of TEOS (trimethyl-orthosilicate). In other embodiments, the formation of the dielectric layer 207 may also comprise spin-on techniques and the formation of an intermediate etch stop layer or etch indicator layer (not shown) to thereby precisely define a depth of a trench that may have to be formed in accordance with an actual fabrication process.

Thereafter, photolithography may be employed to form a resist mask (not shown) in conformity with design rules for the vias 208 and 258. It should be appreciated that, depending on the device dimensions, highly sophisticated lithography techniques may be required including the formation of an efficient anti-reflective coating (ARC) layer to achieve the required resolution. For convenience, an ARC layer is not shown in the figures.

As is well known, advanced semiconductor devices have now reached critical feature sizes of 50 nm and even less at the transistor level, thereby requiring metal lines and vias having dimensions on the order of a magnitude of 100 nm and less, wherein, in particular, the vias 208, 258 may have an aspect ratio (depth/diameter) of 5 and even higher. For such extremely scaled devices, the contact resistivity between the metal regions 203, 253 and the vias 208, 258 after having been filled with metal significantly depends on the characteristics of the interface, and hence significantly depends on the surface characteristics of a surface portion 203a, 253a, which is exposed during an anisotropic etch process for etching through the dielectric layer 207 and, finally, through the etch stop layer 210.

During the final etch step through the etch stop layer 210, reactive gas components and byproducts, such as fluorine, oxygen and the like, are present and may react with the exposed surface portion 203a, 253a. In particular, copper readily reacts with fluorine and oxygen to form the contamination layers 211, which may exhibit significant structural variations within each layer 211 and across different vias owing to the highly non-uniform process conditions with respect to the formation of corrosion at the exposed surfaces 203a, 253a. For this purpose, after completion of removal of the etch stop layer 210, a wet chemical process is performed to substantially remove non-uniformities of the layers 211 and substantially reduce or prevent a further formation of corrosion on the surfaces 203a, 253a. In the embodiment shown, different wet chemical processes, as indicated by the arrows 220 and 221, may be performed to estimate the effects of the wet chemical processes with respect to the vias 208 and 258.

It should be appreciated that the example shown is of illustrative nature only and the plurality of vias 208, 258 may be provided on different substrates, or at different dies of the substrate 201, wherein, for example, the via 258 may be masked, for instance by a polymer material and the like, while the via 208 is subjected to the chemical process 220. Hence, a plurality of different compositions and/or process parameters may be estimated in view of their effect on the contamination layers 211 and the further processing of the semiconductor structure 200. In one particular embodiment, the wet chemical processes 220 and 221 are performed on the basis of a formulation including an etchant and a surface reactant that may undergo a chemical reaction with the exposed metal surfaces 203a, 253a, thereby forming a substantially continuous passivation layer. In other embodiments, the surface reactant may represent a so-called corrosion inhibitor, for instance on the basis of triazole or any compounds thereof, such as benzene triazole (BTA), as are known in the art for preventing or reducing corrosion of copper surfaces and the like. In one embodiment, the etchant for removing surface contaminations in the layers 211 may comprise diluted fluoric acid (HF). Hence, corresponding formulations of differing compositions may be employed under specified process conditions, such as temperature, duration and the like, to perform the plurality of treatments 220 and 221 for passivating the surfaces 203a, 253a.

Thereafter, in some embodiments, one or more characteristics of the metal regions 203, 253 and/or the vias 208, 258 may be determined in order to estimate the status of the surfaces 203a, 253a having experienced the different wet chemical processes 220, 221. Based on corresponding measurement results, which may be obtained by electron microscopy, voltage contrast techniques and the like, an adequate process recipe for a wet chemical treatment may be selected, which may then be used for the processing one or more other substrates during the formation of a corresponding metallization layer in product substrates. In other embodiments, the effect of the plurality of wet chemical processes 220, 221 may be assessed during a later manufacturing stage, thereby also including any synergetic effects that may be created by the various wet chemical processes 220, 221 with subsequent processes. That is, the electrical behavior may be examined and estimated to select a suitable wet chemical process recipe for a semiconductor device type of interest.

Figure 2B:
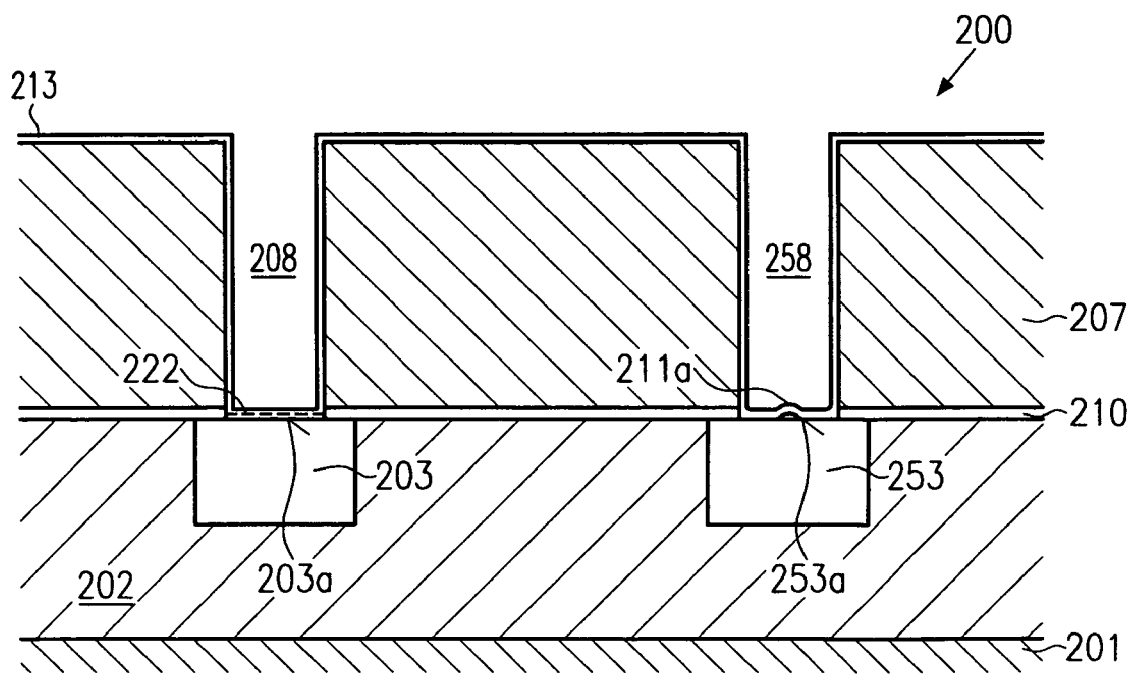

FIG. 2b schematically shows the semiconductor structure 200 in an advanced manufacturing stage. Here, a barrier/adhesion layer 213, for instance comprised of tantalum, tantalum nitride, titanium, titanium nitride and the like, is formed on the dielectric layer 207 and within the vias 208 and 258. The barrier/adhesion layer 213 may be formed in accordance with well-established sputter deposition techniques, wherein an initial sputter etch process is performed to clean the surfaces 203a, 253a, which may have been modified by the preceding wet chemical treatments 220, 221. Due to the removal of fluorine and oxygen based contaminations and a certain degree of homogeneous surface passivation, the sputtering process may be highly efficient and uniform, wherein it is assumed that the wet chemical treatment 220 is based on a process recipe resulting in a substantially homogeneous passivation layer 222, which may be removed substantially uniformly during the initial phase of the sputter process. Consequently, the formation of the layer 213 at the bottom of the via 208 is substantially determined by the process parameters of the sputter deposition rather than by non-uniformities of contamination residues, as may be the case in the conventional approaches. Similarly, the layer 213 at the bottom of the via 258 may have an irregularity 211a, although significantly reduced compared to the conventional irregularities described with reference to FIG. 1c, owing to a less effective process recipe of the wet chemical treatment 221.

Thereafter, the manufacturing process for forming a metallization layer may be continued by the deposition of further barrier layers and a seed layer, followed by the electro-chemical deposition of a metal, such as copper, and a subsequent removal of excess material, as is well-known for the damascene technique. After the formation of the barrier/adhesion layer 213 and/or after the formation of any further layers, one or more characteristics of the vias 208, 258 and the metal regions 203, 253 may be examined to select an appropriate process recipe for a fabrication process of a metallization layer under consideration. For example, after having completed the vias 208, 258, i.e., after being filled with copper and after the removal of the excess material, the electrical resistivity of the metal-filled vias 208, 258 may be investigated, possibly in combination with a reliability test under sophisticated environmental conditions in order to gain additional information on the effect of the wet chemical treatment 220 and 221. For this purpose, the time to failure of the plurality of metal-filled vias 203, 253 may be determined for a given current density and operating temperature. Moreover, the electrical resistance of the vias 203, 253 may be determined. On the basis of these results, possibly in combination with direct measurements of the surface texture at the via bottom 203a, 253a, an appropriate recipe may be determined. Once an appropriate process recipe is selected, in the present case, the recipe of the treatment 220, product substrates may be manufactured based on the established process recipe.

With reference to FIGS. 3a-3d, a process for forming a metallization layer including a via will be described in more detail, wherein a wet chemical treatment is performed based on an appropriate process recipe, which may have been established on the basis of the embodiments as previously described with reference to FIGS. 2a and 2b.

Figure 3A:
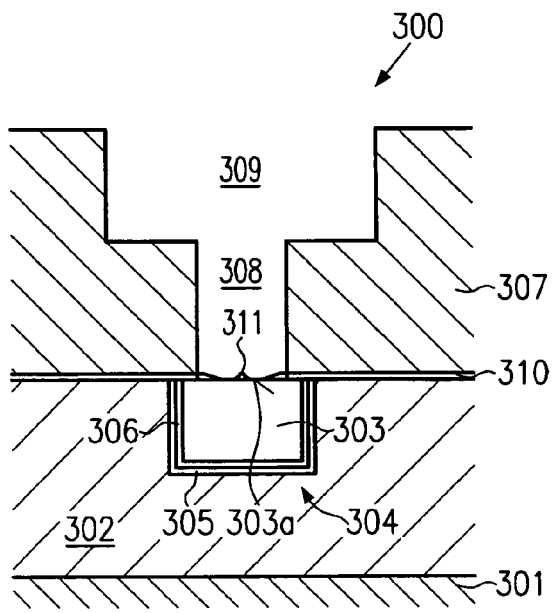
FIGS. 3a-3d schematically show a semiconductor structure during various manufacturing stages in forming a copper-based metallization layer according to further illustrative embodiments of the present invention.

In FIG. 3a, a semiconductor structure 300 comprises a substrate 301 having formed thereon a first metallization layer comprised of a first dielectric layer 302 including a metal line 304 containing a metal 303 and barrier and adhesion layers 306 and 305. With respect to the material composition of the various components, the same criteria apply as previously pointed out with respect to FIG. 1a. The same applies for a second dielectric layer 307 formed on an etch stop layer 310, wherein an opening 308 is formed through the dielectric layers 307 and 310. Furthermore, a trench 309 may be formed in an upper portion of the layer 307. Moreover, contaminations 311 may be formed on a surface portion 303a, which may be comprised of fluorine, oxygen, and copper when the metal 303 is a copper-based metal region.

Regarding the formation of the semiconductor structure 300 as shown in FIG. 3a, substantially the same processes may be applied as previously described with respect to FIGS. 1a and 2a. In particular, the contaminations 311 may be formed during the anisotropic etch process for forming the via 308 through the dielectric layer 307 and the etch stop layer 310.

Figure 3B:
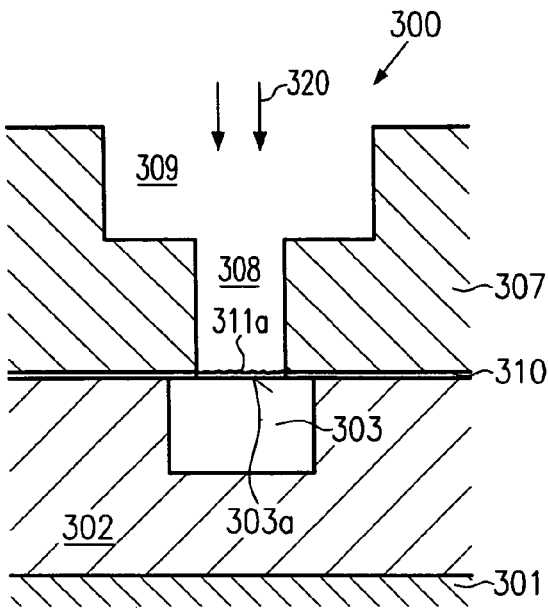

FIG. 3b schematically shows the semiconductor structure 300 during a wet chemical process, as indicated by the arrow 320, for modifying the surface 303a to exhibit a substantially uniform condition. For this purpose, a wet chemical treatment 320 is performed on the basis of an adequate process recipe to provide a substantially uniform surface area 311a on top of the surface 303a. In some embodiments, the wet chemical process 320 may be performed on the basis of a formulation including at least two different components, such as an etchant and a corrosion inhibitor that is applied to the semiconductor structure 300 in accordance with the specified process recipe and process conditions. During the removal of the contaminations 311 by the etchant, such as fluoric acid, the corrosion inhibitor simultaneously reduces or avoids a further formation of contaminants. In some embodiments, the corrosion inhibitor may form a thin passivation layer to substantially avoid the corrosion of the surface 303a during the further handling of the semiconductor structure 300.

In other embodiments, the wet chemical process 320 may be performed such that an etchant is supplied first to significantly reduce the contaminations 311, while a second component in the form of a corrosion inhibitor, surface reactant, and the like is supplied in a timely delayed manner to provide a passivation layer after the majority of the contamination 311 is already removed. It should be noted that a corresponding sequence of supplying the etchant and the surface reactant may also be established on the basis of the embodiments described with reference to FIGS. 2a and 2b, in which appropriate process recipes may be obtained.

In one particular embodiment, the dielectric layer 307 may comprise fluorine-doped silicon dioxide and the wet chemical process 320 may be performed on the basis of HF in an amount of approximately 3-10 volume parts, triazole, benzene triazole (BTA), or any other triazole compound with an amount of approximately 0.5-3 volume parts, and 100 volume parts de-ionized water at a temperature of approximately 30-80° C. With an exposure time of approximately 5-30 seconds, the surface 303a may substantially homogeneously be modified for a via diameter of approximately 100 nm with an aspect ratio of approximately 5 or more.

Figure 3C:
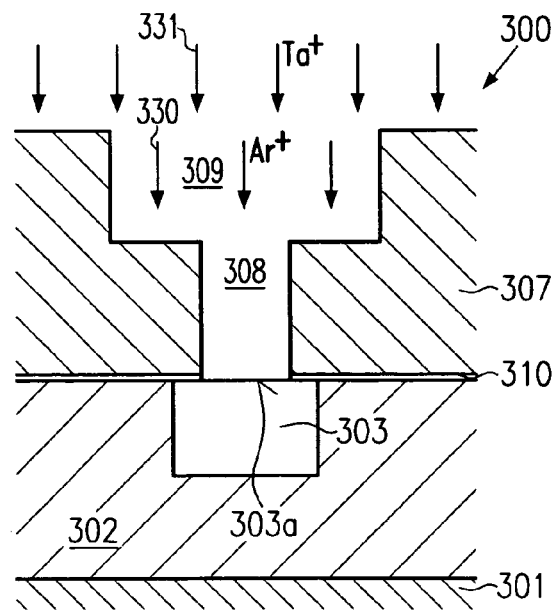

FIG. 3c schematically shows the semiconductor structure 300 during the formation of a barrier/adhesion layer by means of a sputter process 331, which includes a pre-cleaning process 330. As previously explained with reference to FIG. 1b, usually a pre-clean process is performed to remove contaminants from the surface 303a. Due to the preceding wet chemical process 320, the substantially homogenous modification 311a of the surface 303a may be removed highly efficiently and uniformly, so that during the subsequent sputter deposition 331 the formation of any surface irregularities is significantly reduced. In other embodiments, the deposition process 331 may represent a self-limiting deposition technique, known as atomic layer deposition, if very sophisticated barrier/adhesion layers are needed due to extremely scaled semiconductor devices requiring the via 308 to have a diameter of 80 nm and even less. It should be appreciated that the substantially uniform, defect-free surface 303a offers the possibility of a further device scaling without jeopardizing reliability of the metallization of the device, since the contact resistance of the via 308 to the underlying metal region 303 may be significantly less compared to conventional techniques, which may produce an increased amount of surface irregularities.

Figure 3D:
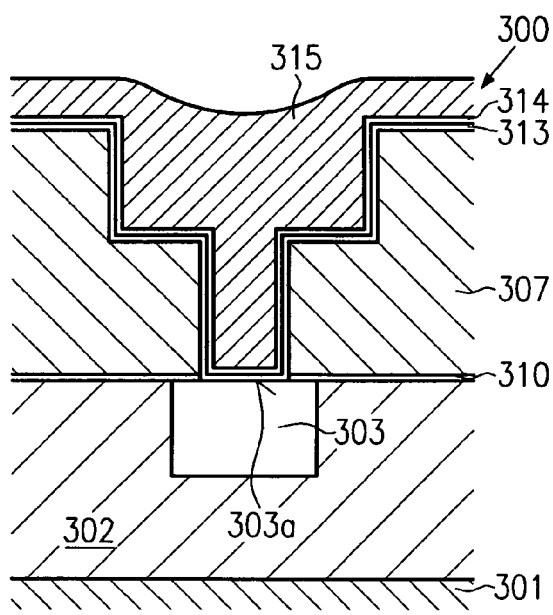

FIG. 3d schematically shows the semiconductor structure 300 after the formation of a barrier/adhesion layer 313 by means of the deposition process 331, and with a seed layer 314 and a metal bulk layer 315 formed on the barrier/adhesion layer 313. Currently, copper is a preferred candidate for the seed layer 314 and the bulk metal layer 315. It should be appreciated, however, that any appropriate material composition may be used for the layers 314 and 315 in accordance with design requirements. Moreover, as previously noted, the barrier/adhesion layer 313 may be comprised of two or more sub-layers, depending on the characteristics of the metal contained in the bulk layer 315.

In the embodiments described with reference to FIGS. 3a-3d, the order of forming the trench 309 and the via 308 is not critical and hence the wet chemical process 320 (FIG. 3b) may be performed prior to the formation of the trench 302, wherein the substantially homogenous modification 311a of the surface 303a substantially avoids any further contamination of the surface 303a during subsequent processes for forming the trench 309.

As a result, the present invention provides a technique that enables the formation of vias connecting to metal regions, such as copper, with a significantly reduced amount of irregularities that may be conventionally formed at the interface between the via and the metal region. A combination of a wet chemical etch process and a surface modification, such as the formation of a thin passivation layer, results in a significantly reduced defect rate and in an enhanced via reliability, thereby also improving the total production yield. The wet chemical process may be performed on the basis of a formulation including at least two components, that is, an etchant and a corrosion inhibitor, which may be supplied simultaneously or in a timely delayed fashion. Appropriate process recipes, i.e., an adequate composition of the formulation and specific process conditions, may be established on the basis of test structures and/or product substrates to readily adapt the process recipe of the wet chemical process to the various device generations.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
preparing a plurality of different formulations for a wet chemical clean process, each formulation comprising an etchant and a corrosion inhibitor;
forming a plurality of vias in a dielectric layer, said vias connecting to respective metal regions formed below said vias;
treating at least some of the plurality of vias with said plurality of different formulations under specified process conditions to modify an exposed surface portion of said respective metal regions;
determining at least one characteristic of said plurality of vias and respective metal regions;
selecting an appropriate composition and target process parameters for said wet chemical clean process on the basis of said at least one characteristic; and
treating a plurality of substrates including vias formed in a dielectric layer with said appropriate composition and target process parameters during the formation of a metallization layer of a semiconductor device.

2. The method of claim 1, wherein said plurality of formulations differ at least in one of an amount of etchant, an amount of corrosion inhibitor, a type of etchant and a type of corrosion inhibitor.

3. The method of claim 1, wherein determining at least one characteristic comprises at least one of measuring a surface texture of the via bottoms, measuring a reliability of the metal-filled vias in a stress test and measuring the electrical resistivity of the metal-filled vias.

4. A method, comprising:
forming a via in a dielectric layer, the via connecting to a metal region located below said via;
treating a surface portion of said metal region that is exposed during the formation of said via by a wet chemical formulation including a surface reactant;
cleaning said surface portion; and
forming a barrier/adhesion layer on said surface portion, wherein cleaning said surface portion and forming said barrier/adhesion layer are performed as in situ processes and said barrier/adhesion layer is formed by atomic layer deposition.

5. The method of claim 4, wherein said wet chemical formulation comprises an etchant for removing contaminants on said surface portion that are formed during and after the formation of said via.

6. The method of claim 4, wherein cleaning said surface portion and forming said barrier/adhesion layer are performed in a common sputter process.

7. The method of claim 4, wherein said surface reactant comprises a corrosion inhibitor.

8. The method of claim 7, wherein said corrosion inhibitor comprises at least one of an agent based on triazole and an agent based on a compound of triazole.

9. The method of claim 4, further comprising depositing a seed layer on said barrier/adhesion layer and filling said via with a metal.

10. The method of claim 9, wherein said metal comprises copper.

* * * * *